United States Patent
Hamilton

(10) Patent No.: US 12,130,339 B2
(45) Date of Patent: Oct. 29, 2024

(54) SYSTEM AND METHOD FOR SENSING ONE OR MORE POWER LINES

(71) Applicant: ACLARA TECHNOLOGIES LLC, St. Louis, MO (US)

(72) Inventor: Douglas Hamilton, Arlington Heights, IL (US)

(73) Assignee: Aclara Technologies LLC, St. Louis, MO (US)

( * ) Notice: Subject to any disclaimer, the term of this patent is extended or adjusted under 35 U.S.C. 154(b) by 102 days.

(21) Appl. No.: 17/011,402

(22) Filed: Sep. 3, 2020

(65) Prior Publication Data

US 2021/0072325 A1 Mar. 11, 2021

Related U.S. Application Data

(60) Provisional application No. 62/896,201, filed on Sep. 5, 2019.

(51) Int. Cl.
*G01R 31/52* (2020.01)
*G01R 31/08* (2020.01)

(52) U.S. Cl.
CPC ........... *G01R 31/52* (2020.01); *G01R 31/085* (2013.01)

(58) Field of Classification Search
CPC ............ G01R 31/08–086; G01R 31/52; G01R 31/54; G01R 31/58
See application file for complete search history.

(56) References Cited

U.S. PATENT DOCUMENTS

| | | | |
|---|---|---|---|
| 4,795,973 A | 1/1989 | Smith-Vaniz et al. | |
| 5,416,418 A * | 5/1995 | Maureira | G01R 31/083 324/532 |
| 5,530,364 A * | 6/1996 | Mashikian | G01R 31/083 324/529 |
| 5,565,783 A | 10/1996 | Lau et al. | |
| 5,764,065 A | 6/1998 | Richards et al. | |
| 9,547,033 B1 * | 1/2017 | Batten | G01R 31/08 |
| 10,073,132 B2 * | 9/2018 | Cern | G01R 31/12 |
| 2007/0059986 A1 | 3/2007 | Rockwell | |
| 2009/0287430 A1 * | 11/2009 | Atoji | G01R 31/52 702/58 |
| 2010/0271044 A1 * | 10/2010 | Keret | G01R 31/085 324/544 |
| 2012/0046799 A1 | 2/2012 | Alex et al. | |

(Continued)

FOREIGN PATENT DOCUMENTS

| CN | 104422480 A | 3/2015 |
|---|---|---|
| CN | 105652168 A * | 6/2016 |

(Continued)

OTHER PUBLICATIONS

PCT/US2020/049160 International Search Report and Written Opinion dated Dec. 18, 2020.

(Continued)

*Primary Examiner* — Lee E Rodak
*Assistant Examiner* — Demetrius R Pretlow
(74) *Attorney, Agent, or Firm* — Michael Best & Friedrich LLP

(57) ABSTRACT

A power line sensor including a housing and a near field sensor. The housing is configured to couple to a power line. The near field sensor is configured to sense a leakage current on the power line.

6 Claims, 5 Drawing Sheets

(56) References Cited

U.S. PATENT DOCUMENTS

| | | | |
|---|---|---|---|
| 2013/0169285 A1* | 7/2013 | Phillips | G01R 15/186 |
| | | | 324/509 |
| 2014/0123750 A1* | 5/2014 | Liu | G01N 17/00 |
| | | | 73/170.17 |
| 2014/0278150 A1 | 9/2014 | Baesler et al. | |
| 2015/0331025 A1 | 11/2015 | Arashima et al. | |
| 2016/0370419 A1* | 12/2016 | Poluru | G01R 35/00 |
| 2017/0030956 A1 | 2/2017 | McCammon et al. | |
| 2017/0045571 A1 | 2/2017 | Joseph et al. | |
| 2017/0206781 A1* | 7/2017 | Miller | H04Q 9/00 |
| 2017/0227593 A1* | 8/2017 | Hackl | H02H 3/16 |
| 2017/0285091 A1 | 10/2017 | Jiang et al. | |
| 2018/0164361 A1* | 6/2018 | Premerlani | B60L 50/10 |
| 2018/0188307 A1* | 7/2018 | Logvinov | G01R 31/52 |
| 2019/0227110 A1 | 7/2019 | Lindsey et al. | |
| 2020/0072814 A1* | 3/2020 | Bailey | G01M 5/0066 |
| 2020/0096551 A1* | 3/2020 | Emanuel | G01R 31/11 |

FOREIGN PATENT DOCUMENTS

| | | | | | |
|---|---|---|---|---|---|
| CN | 205301502 U | | 6/2016 | | |
| CN | 106597224 A | * | 4/2017 | | |
| CN | 207623451 U | | 7/2018 | | |
| CN | 110031727 A | * | 7/2019 | | |
| CN | 112557805 A | * | 3/2021 | | |
| EP | 2 866 041 A1 | | 4/2015 | | |
| EP | 3499253 A1 | * | 6/2019 | | |
| FR | 3033198 A1 | * | 9/2016 | | G01R 15/183 |
| JP | 2004361248 A | * | 12/2004 | | G01R 1/22 |
| JP | 2004525344 A | * | 8/2019 | | |
| KR | 20090081772 A | * | 7/2009 | | |
| KR | 101444733 B1 | * | 9/2014 | | |
| KR | 101531641 B1 | * | 7/2015 | | |
| KR | 101762577 B1 | * | 7/2017 | | |
| KR | 101820426 B1 | * | 1/2018 | | |

OTHER PUBLICATIONS

Extended European Search Report dated Aug. 2, 2023 for corresponding European Application No. 20859801.1.

* cited by examiner

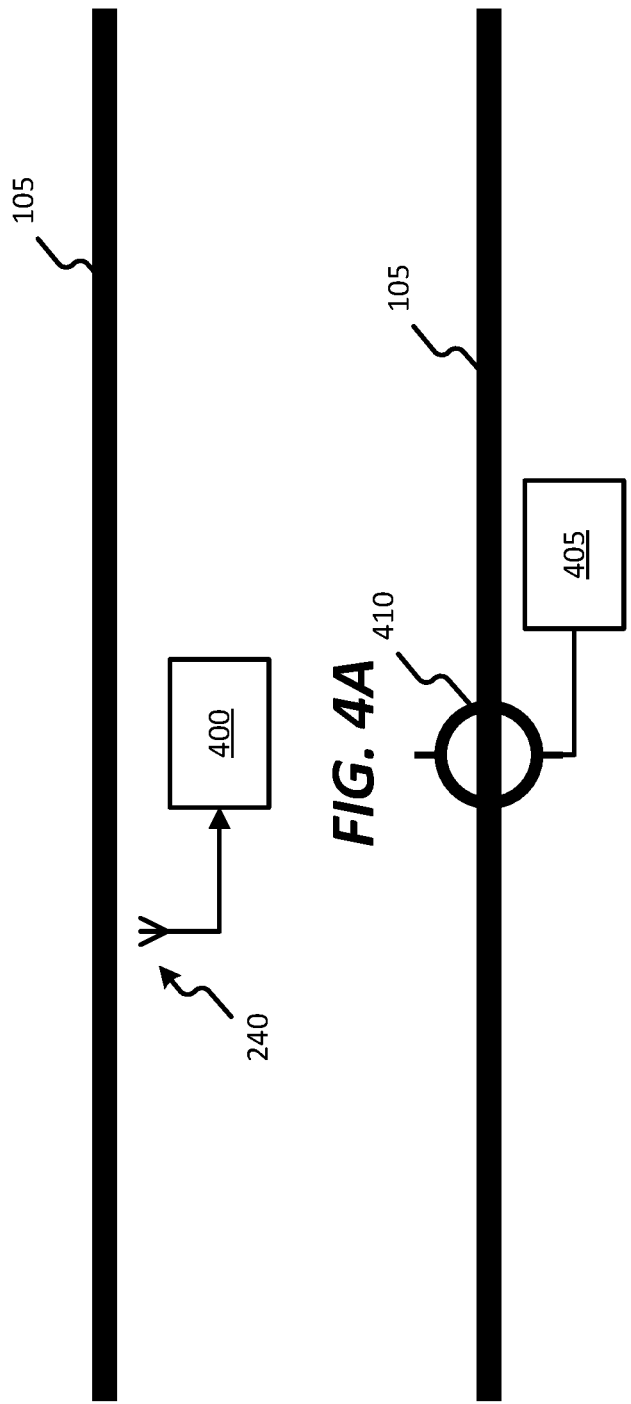
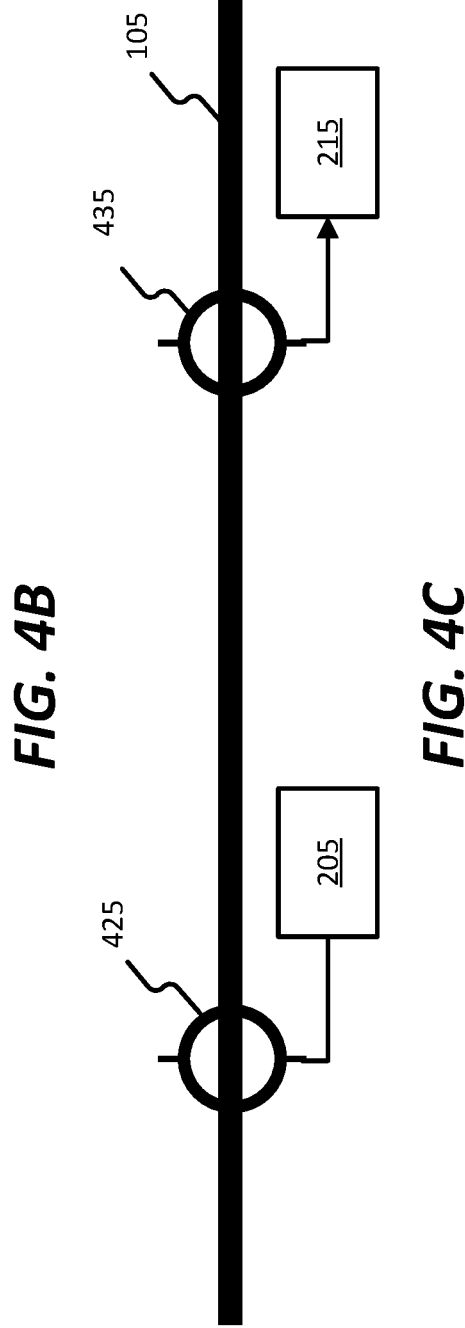

SYSTEM AND METHOD FOR SENSING ONE OR MORE POWER LINES

RELATED APPLICATIONS

This application claims priority to U.S. Provisional Patent Application No. 62/896,201, filed Sep. 5, 2019, the disclosure of which is incorporated herein by reference in its entirety.

FIELD

Embodiments relate to power line sensors.

SUMMARY

Power line events may be detected by sensing partial discharge, which may be a low leakage current from a primary through a path of least resistance to ground. Early detection of low leakage current may be used to correct and prevent power line events before they occur. Leakage current may be detected via ground based and/or aerial assessments. However, such assessments may be overly expensive and timely.

Thus, one embodiment provides a power line sensor including a housing and a near field sensor. The housing is configured to couple to a power line. The near field sensor is configured to sense a leakage current on the power line.

Another embodiment provides a method of determining a potential event of a power line. The method includes sensing, via a near field sensor, a leakage current on the power line. The method further includes determining, via an electronic processor, a potential event based on the leakage current on the power line.

Yet another embodiment provides a system for determining a potential event on a power line. The system includes a first line sensor, a second line sensor and an electronic processor. The first line sensor includes a first near field sensor configured to sense a first leakage current at a first location on the line. The second line sensor includes a second near field sensor configured to sense a second leakage current at a second location on the line. The electronic processor is configured to receive data corresponding to the first leakage current and the second leakage current, and determine a location of a potential event on the line based on the data.

Other aspects of the application will become apparent by consideration of the detailed description and accompanying drawings.

BRIEF DESCRIPTION OF THE DRAWINGS

FIGS. 4A-4C illustrate line sensors according to some embodiments.

DETAILED DESCRIPTION

Before any embodiments of the application are explained in detail, it is to be understood that the application is not limited in its application to the details of construction and the arrangement of components set forth in the following description or illustrated in the following drawings. The application is capable of other embodiments and of being practiced or of being carried out in various ways.

Figure 1:
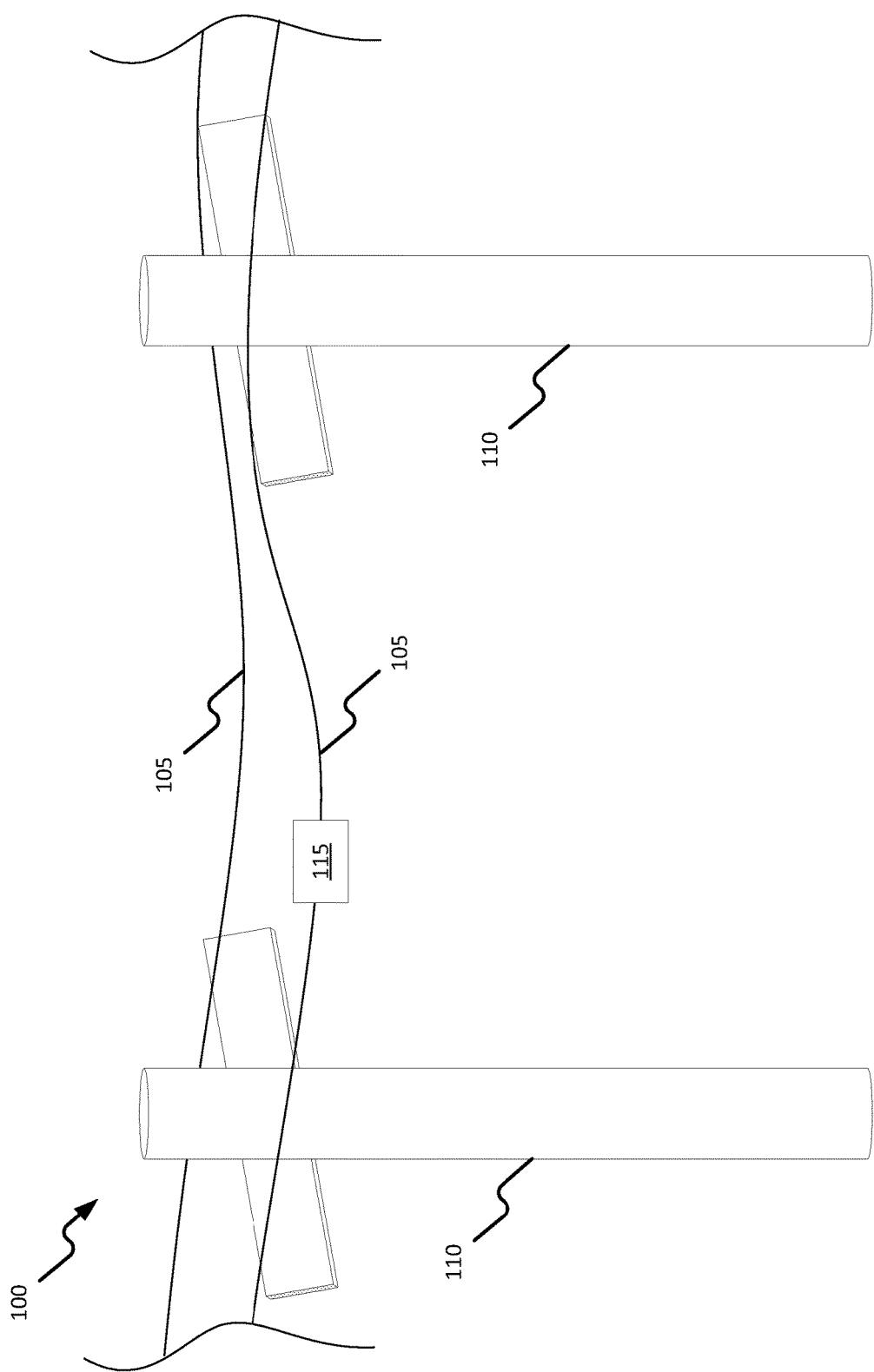
FIG. 1 illustrates a utility distribution system according to some embodiments.

FIG. 1 illustrates a utility distribution system 100 according to some embodiments. In the illustrates embodiment, the system 100 includes one or more power lines 105 supported by one or more utility poles 110. Although illustrated as being supported by utility poles 110, in other embodiments, the power lines 105 may be underground and/or supported by other structures (for example, buildings). The system 100 may further include a line sensor 115.

Figure 2:
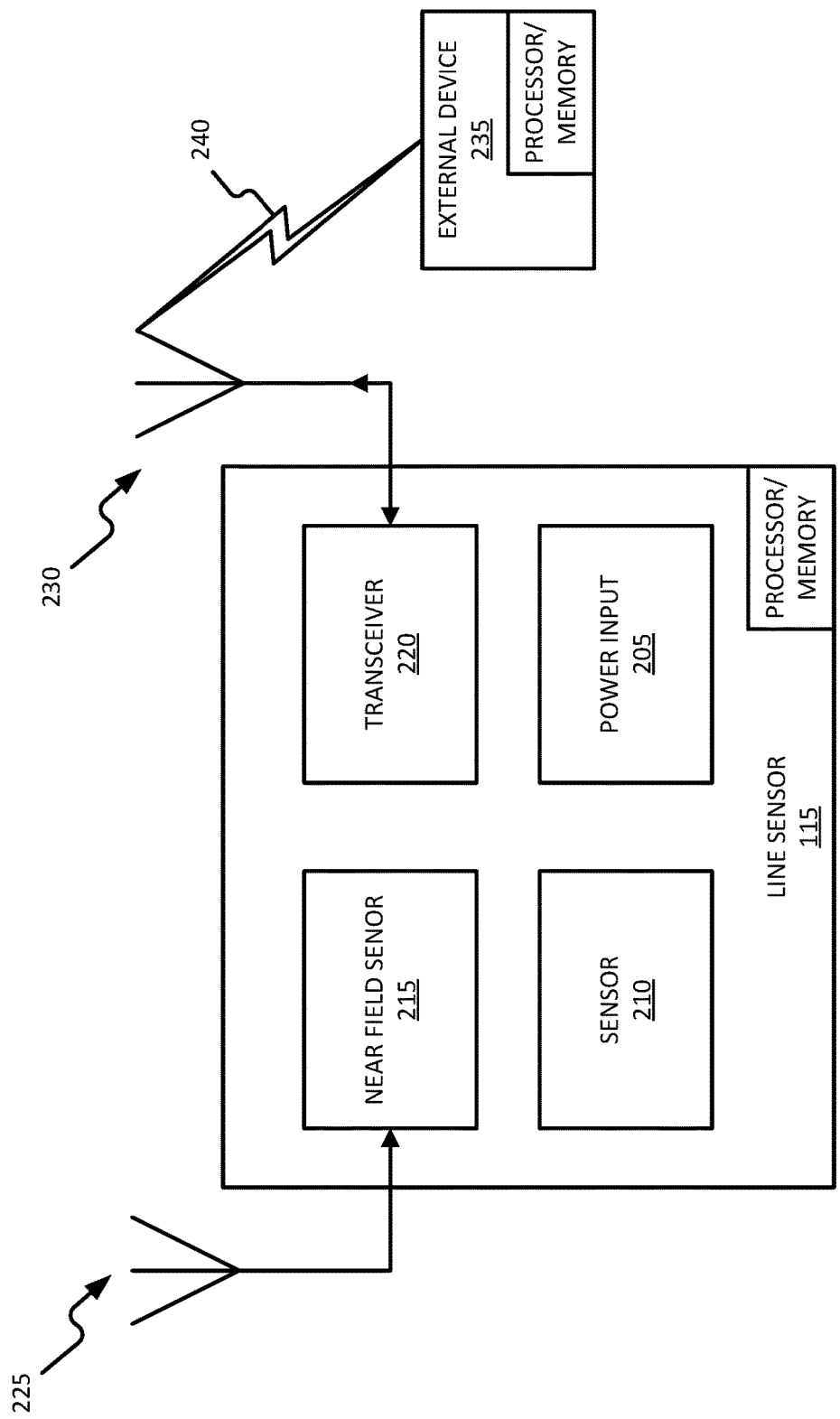
FIG. 2 is a block diagram illustrating a line sensor configured to sense one or more characteristics of a line of the utility distribution system of FIG. 1 according to some embodiments.

FIG. 2 is a block diagram of the line sensor (such as, but not limited to, a power line sensor) 115 according to some embodiments. The line sensor 115 may be configured to couple directly onto the line 105 and sense one or more characteristics of the line 105. In some embodiments, the line sensor 115 is coupled to the line 105 by clamping around the line 105.

In the illustrated embodiment, the line sensor 115 includes a power input 205, a characteristic sensor 210, a near field sensor 215, and a transceiver 220. In some embodiments, the line sensor 115 further includes an electronic processor and a memory. The electronic processor and/or memory may be configured to provide signal conditioning and/or detecting. The power input 205 may be configured to receive power from line 105, convert the line power to a nominal power, and provide power to other components and/or modules of the line sensor 115.

The characteristic sensor 210 may be configured to sense one or more characteristics of the line 105. In some embodiment, the sensed characteristics include electrical characteristics, such as but not limited to, a line voltage and a line current. In some embodiments, the sensed characteristics include one or more temperatures, such as but not limited to, a line temperature and/or an ambient temperature. In some embodiments, the sensed characteristics include an inclination and/or an amount of line sagging, wind movement, electrical fields, power generation, and/or distribution and consumption of electricity.

The near field sensor 215 may be configured to detect a leakage current of line 105. The leakage current of line 105 may be a leakage current from a primary of the line 105 through a path of least resistance to ground. In some embodiments, the near field sensor 215 detects the leakage current by sensing, a discharged, or partial discharge, radio frequency from line 105. As illustrated, in some embodiments, the near field sensor 215 senses the discharged radio frequency via a near field antenna 225.

In some embodiments, the near field sensor 215 is a conductive sensor. In some embodiments, the near field sensor 215 is an electromagnetic sensor. In such an embodiment, the near field sensor 215 may sense the leakage current via electromagnetic radiation sensing (or radiation sensing), radio frequency sensing, light sensing (for example, ultraviolet sensing, infrared sensing, etc.), and/or thermal sensing. In some embodiments, the near field sensor 215 is an acoustic sensor. In such an embodiment, the near field sensor 215 may sense the leakage current via audio sensing (for example, apparatus (such as, but not limited to audio sensors) and methods disclosed in U.S. Pat. No. 10,440,472, hereby incorporated by reference) and/or ultrasonic sensing. In some embodiments, the near field sensor 215 is a gas sensor. In such an embodiment, the near field sensor 215 may sense the leakage current via ozone sensing and/or nitrous oxide sensing.

The transceiver 220, along with a transceiver antenna 230, may be configured to enable wireless communication to/from the line sensor 115. In other embodiments, rather than a transceiver 220 and transceiver antenna 230, the line sensor 115 may include separate transmitting and receiving components, for example, a transmitter, a transmitting antenna, a receiver, and a receiving antenna. In some embodiments, the transceiver 220 may be configured to enable wired communication to/from the line sensor 115.

The line sensor 115, via the transceiver 220, may communicate with an external device 235. In some embodiments, the line sensor 115 wirelessly communicates with the external device via a communication link 240. In some embodiments, the communication link 240, for example, a wide area network (WAN) (e.g., a transport control protocol/internet protocol (TCP/IP) based network, a cellular network, such as, for example, a Global System for Mobile Communications (or Groupe Special Mobile (GSM)) network, a General Packet Radio Service (GPRS) network, a Code Division Multiple Access (CDMA) network, an Evolution-Data Optimized (EV-DO) network, an Enhanced Data Rates for GSM Evolution (EDGE) network, a 3GSM network, a 4GSM network, a Digital Enhanced Cordless Telecommunications (DECT) network, a Digital advanced mobile phone system (AMPS) (IS-136/time division multiple access (TDMA)) network, or an Integrated Digital Enhanced Network (iDEN) network, etc.). In other embodiments, the communication link 240 is, for example, a local area network (LAN), a neighborhood area network (NAN), a home area network (HAN), or personal area network (PAN) employing any of a variety of communications protocols, such as Wi-Fi, Bluetooth, ZigBee, etc. Other wide area networks, such as land mobile radio (LMR), terrestrial trunked radio (TETRA), and digital mobile radio (DMR) may also be used. In some embodiments, the line sensor 115 uses one or more of the above communication protocols.

The external device 235 may be, but is not limited to, an external computer, one or more server(s), a smart telephone, a tablet, and/or a laptop. As illustrated, the external device 235 may be remote from the line sensor 115. The external device 235 may include an electronic processor and a memory. In one embodiment of operation, the external device 235 receives data corresponding to the one or more characteristics of the line 105 and/or the leakage current of the line 105. The external device 235 then analyzes the data to detect potential events that may occur on the line 105.

Figure 3:
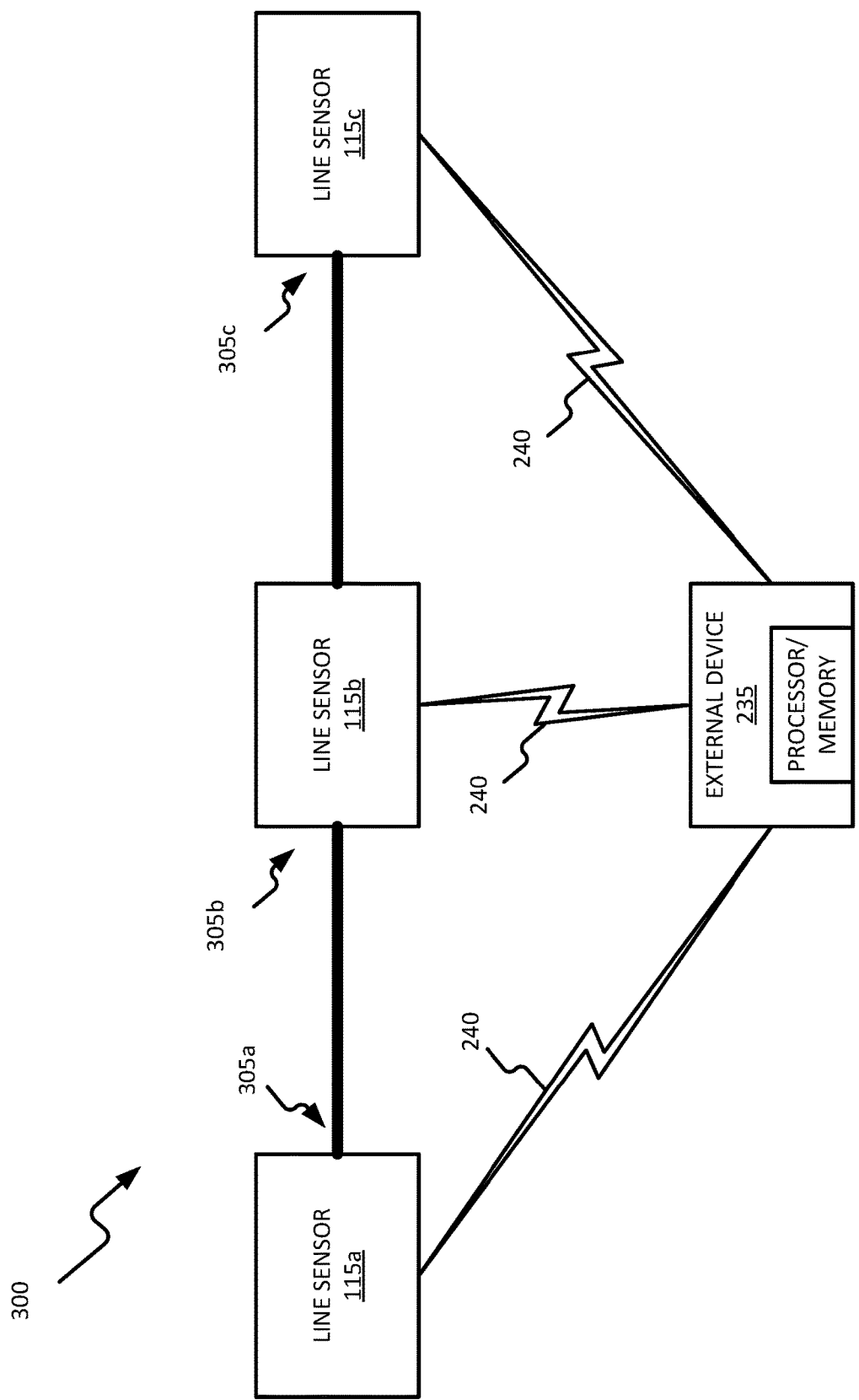
FIG. 3 is a block diagram illustrating a line sensing system configured to sense one or more characteristics of the utility distribution system of FIG. 1 according to some embodiments

FIG. 3 is a block diagram illustrating a line sensing system 300 according to some embodiments. The system 300 may include one or more line sensors 115a, 115b, 115c coupled to the line 105 at various line portions 305a, 305b, 305c. In some embodiments, the various line portions 305 may be located at equal distances from each other and/or varying distances from each other. Although only illustrated as including three line sensors, in other embodiments the system 300 may include four or more line sensors. Each sensor 115a, 115b, 115c may be communicatively coupled to the external device 235, so that the external device 235 may receive data from each line sensor 115a, 115b, 115c.

In one embodiment of operation, the external device 235 receives data corresponding to leakage current at one or more of the various portions 305a, 305b, 305c on line 105 corresponding to locations of the sensors 115a, 115b, 115c. Based on the data from line sensors 115a, 115b, 155c, the external device 235 may determine a potential event and/or extrapolate the location of a potential event on the line 105. For example, a first leakage current detected by line sensor 115a having a greater magnitude than a second leakage current detected by line sensor 115b may correspond to a potential event occurring between line sensors 115a, 115b in an area closer to line sensor 115a than line sensor 115b. The external device 235 may then output alerts and/or notification of the potential event and/or the location of the potential event on the line 105.

FIG. 4A illustrates a line sensor 400 according to some embodiments. Line sensor 400 may include similar components and functionality as line sensor 115, including signal conditioning and/or detecting. Similar to line sensor 115, line sensor 400 may include a transceiver 240 configured to sense a leakage current of line 105 via near field sensing.

FIG. 4B illustrates a line sensor 405 according to some embodiments. Line sensor 405 may include similar components and functionality as line sensor 115, including signal conditioning and/or detecting. Line sensor 405 may include a current transformer (CT) 410 in addition to, or in lieu of, transceiver 240. In some embodiments, CT 410 is a coil wound around a core (for example, a toroidal ferrite core). The line 105 may pass through the core of CT 410. In one embodiment of operation, the CT 410 senses a leakage current and line sensor 405 performs signal conditioning and/or detection of the sensed leakage current. In some embodiments, CT 410 may receive power from line 105, as well as sense a leakage current on line 105.

FIG. 4C illustrates a line sensor 415 according to some embodiments. Line sensor 415 may include similar components and functionality as line sensor 115, including signal conditioning and/or detecting. Line sensor 415 may include a first CT 420 and a second CT 425. In some embodiments, first and second CTs 420, 425 may be substantially similar to CT 410. In one embodiment of operation, line sensor 415 may receive power via first CT 420 and supply the power to power input 205, while the second CT 425 may be used to sense a leakage current on line 105.

Figure 5:
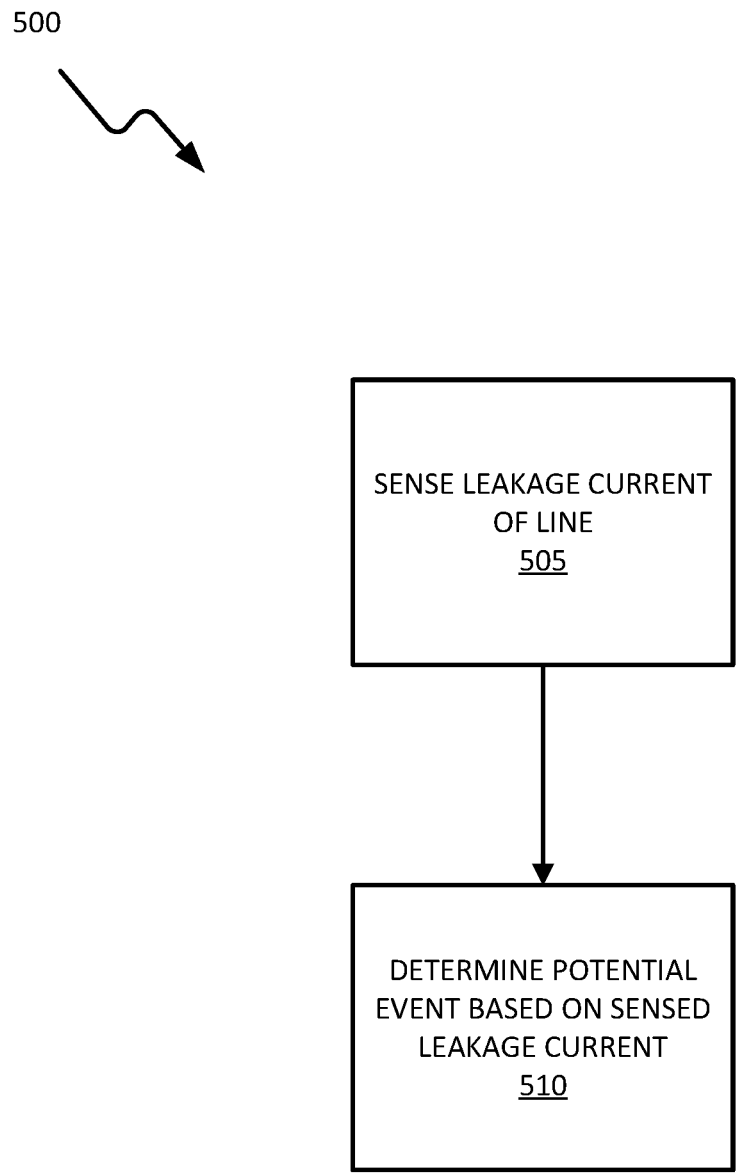
FIG. 5 is a flowchart illustrating a process of sensing one or more characteristics of the utility distribution system of FIG. 1.

FIG. 5 illustrates an operation, or process, 500 according to some embodiments. Process 500 may be performed via line sensor 115, external device 235, line sensor 400, and/or system 300. A leakage current is sensed via a near field sensor (block 505). A potential event is determined based on the sensed leakage current (block 510).

Embodiments provide, among other things, a system and method for determining potential events on a power line. Various features and advantages of the application are set forth in the following claims.

What is claimed is:

1. A system for determining a potential event on a power line, the system comprising:
a first line sensor including a first near field sensor configured to sense a first leakage current at a first location on the line through a first path of least resistance to ground and a first characteristic sensor configured to sense a first characteristic at the first location, wherein the first characteristic includes at least one selected from a group consisting of an amount of sag in the power line at the first location and an amount of wind movement at the first location;
a second line sensor including a second near field sensor configured to sense a second leakage current at a second location on the line through a second path of least resistance to ground and a second characteristic sensor configured to sense a second characteristic at the second location, wherein the second characteristic includes at least one selected from a group consisting of an amount of sag in the power line at the second location and an amount of wind movement at the second location; and an electronic processor configured to
- receive a first leakage current signal from the first line sensor corresponding to the first leakage current and a first characteristic signal from the first characteristic sensor corresponding to the first characteristic,
- receive a second leakage current signal from the second line sensor corresponding to the second leakage current and a second characteristic signal from the second characteristic sensor corresponding to the second characteristic, and
- determine a location of the potential event on the line based on the first leakage current signal, the first characteristic signal, the second leakage current signal, and the second characteristic signal, wherein the location of the potential event is between the first location and the second location.

2. The system of claim 1, wherein the first near field sensor and the second near field sensors are incorporated into current transformers.

3. The system of claim 1, wherein the electronic processor is remote from at least one selected from a group consisting of the first line sensor and the second line sensor.

4. The system of claim 1, wherein the first near field sensor is a conductive sensor.

5. The system of claim 1, wherein the first near field sensor is a radiation sensor.

6. The system of claim 1, wherein the first near field sensor is incorporated into a current transformer.

\* \* \* \* \*